United States Patent [19]
Yee

[11] Patent Number: 5,990,421
[45] Date of Patent: Nov. 23, 1999

[54] BUILT IN BOARD RESISTORS

[75] Inventor: Dawson Yee, Beaverton, Oreg.

[73] Assignee: Intel Corporation, Santa Clara, Calif.

[21] Appl. No.: 08/802,327

[22] Filed: Feb. 18, 1997

[51] Int. Cl.⁶ ..................................................... H05K 1/16
[52] U.S. Cl. ........................... 174/260; 174/262; 361/748; 361/766; 439/74
[58] Field of Search ..................... 174/250, 255, 174/256, 260, 262, 266; 361/748, 751, 765, 766, 771; 439/68, 74

[56] References Cited

U.S. PATENT DOCUMENTS

| | | | |
|---|---|---|---|
| 4,725,925 | 2/1988 | Tanaka et al. | 361/406 |
| 5,098,771 | 3/1992 | Friend | 428/209 |
| 5,418,689 | 5/1995 | Alpaugh et al. | 361/792 |
| 5,451,721 | 9/1995 | Tsukada et al. | 174/261 |
| 5,463,191 | 10/1995 | Bell et al. | 174/263 |
| 5,557,502 | 9/1996 | Banerjee et al. | 361/712 |
| 5,708,569 | 1/1998 | Howard et al. | 361/760 |
| 5,780,143 | 7/1998 | Shimamoto et al. | 174/261 |

*Primary Examiner*—Kristine Kincaid
*Assistant Examiner*—Dhiru R. Patel
*Attorney, Agent, or Firm*—Blakely, Sokoloff, Taylor & Zafman LLP

[57] ABSTRACT

A printed circuit board which has a layer of electrically resistive material that can provide a pull-up/pull-down resistor for the board. The printed circuit board includes a substrate which has a conductive plane located on the top surface of the board. The conductive plane is typically dedicated to electrical power. The board also has a via that is connected to an internal signal line. The resistive material is applied to the top surface to connect the conductive plane to the via and the signal line. The resistive material can be applied with a screening process which simplifies the assembly process of the resistor. Additionally, the resistive material is relatively small and located adjacent to the via so that the resistor does not occupy valuable board space.

4 Claims, 1 Drawing Sheet

BUILT IN BOARD RESISTORS

BACKGROUND OF THE INVENTION

1. Field of the Invention

The present invention relates to a printed circuit board for electronic packages.

2. Description of Related Art

Electronic assemblies typically include a plurality of integrated circuit packages that are mounted to a printed circuit board. The printed circuit board has a number of different conductive power/ground planes and signal lines that provide power and electrical signals to the integrated circuits.

Some electronic assemblies require pull-up or pull-down resistors to hold the signal lines to a desired voltage logic state when not driven by active logic. The pull-up/pull-down resistors are typically discrete devices that are soldered to the top surface of the printed circuit board. Discrete resistor devices are relatively large and occupy valuable routing space on the printed circuit board. Additionally, the inventory space and process steps required to mount the resistors to the board increase the cost of producing the electronic assemblies. It would be desirable to provide a printed circuit board

SUMMARY OF THE INVENTION

The present invention is a printed circuit board which has a layer of electrically resistive material that can provide a pull-up/pull-down resistor for the board. The printed circuit board includes a substrate which has a conductive plane located on the top surface of the board. The conductive plane is typically dedicated to electrical power. The board also has a via that is connected to an internal signal line. The resistive material is applied to the top surface to connect the conductive plane to the via and the signal line. The resistive material can be applied with a screening process which simplifies the assembly process of the resistor. Additionally, the resistive material is relatively small and located adjacent to the via so that the resistor does not occupy valuable board space.

DETAILED DESCRIPTION OF THE INVENTION

Figure 1:
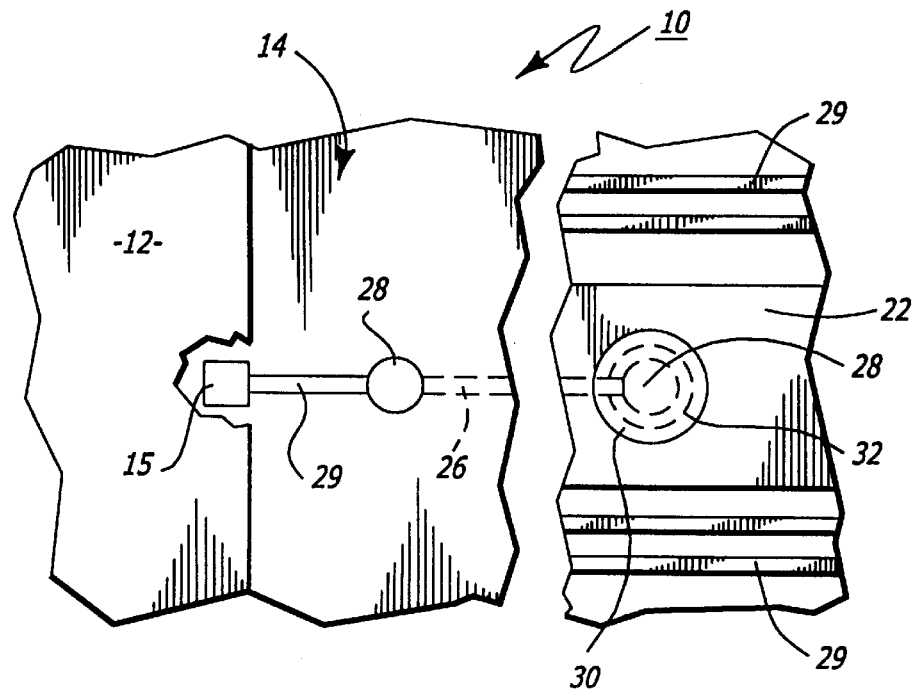
FIG. 1 is a top view of a printed circuit board assembly of the present invention.
Figure 2:
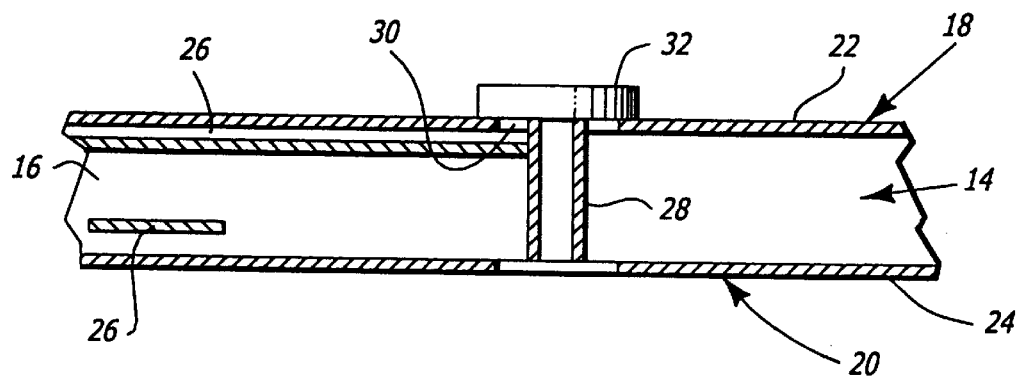
FIG. 2 is a cross-sectional view of the printed circuit board.

Referring to the drawings more particularly by reference numbers, FIGS. 1 and 2 show a printed circuit board assembly 10 of the present invention. The assembly 10 includes an integrated circuit package 12 that is mounted to a printed circuit board 14. The package 12 may contain one or more integrated circuits (not shown) as is known in the art. The package 12 has a number of contacts (not shown) that are soldered to surface pads 15 on the printed circuit board 14. The contacts may be solder balls, pins, or any other means for providing a mechanical and electrical connection between the board 14 and the package 12.

The printed circuit board 14 includes a substrate 16 which has a top surface 18 and an opposite bottom surface 20. Extending along the top surface 18 is a first conductive plane 22. The bottom surface 20 may have a second conductive plane 24. In the preferred embodiment the first conductive plane 22 is dedicated to electrical power and the second conductive plane 24 is dedicated to electrical ground. Alternatively, the first conductive plane 22 may be a line dedicated to digital signals.

The substrate 16 may have a plurality of internal signal lines 26. The signal lines 26 are connected to a plurality of vias 28. Some of the vias 28 connect the signal lines 26 to the surface pads 15 soldered to the contacts of the packages 12 through routing traces 29. Additionally, some of the vias 28 may couple the surface pads 15 to the second conductive plane 24 located on the bottom surface 20 of the substrate 16. The first conductive plane 22 may also be connected to the surface pads 15 by routing traces (not shown) on the top surface 18 of the board. Although not shown, the substrate 16 may have a top layer of solder mask to protect the first conductive plane 22. The conductive planes 22 and 24, and signal lines 26, provide power and electrical signals to the integrated circuit packages 12.

The vias 28 are separated from the first conductive plane 22 by a space 30 in the top surface 18 of the substrate 16. Some of the vias 28 are connected to the first conductive plane 22 by resistors 32. The resistors 32 are each comprised of a layer of electrically conductive material that is applied to the top surface 18 of the substrate 16. The resistors 32 typically connect the first conductive plane 22 with a via 28 that is connected to a signal line 26. The resistors 32 can be connected to either "pull up" a voltage level provided to an input/output (I/O) signal pin of an integrated circuit package, or "pull down" a voltage level provided to the I/O pin of a package.

The resistors 32 have a relatively small profile to minimize the amount of board space required for the devices 32. The small profile provides additional board space to route signal lines on the top surface 18 of the substrate 16.

The printed circuit board assembly 10 is assembled by initially constructing the substrate 16, conductive planes 22 and 24, signal lines 26 and vias 28 with known printed circuit board processes. Conductive material is then applied at selected locations on the substrate 16 to create resistors 32 that connect certain vias 28 to the first conductive plane 22. The conductive material may be an electrically conductive ink that is applied with a dispenser (not shown) and/or a screen template (not shown). The diameter and thickness of the resistive material 32 may be designed to provide a desired ohmic value. Although a dispenser/template process is described, it is to be understood that the pull-up/pull-down resistors 32 may be constructed with other known thick film or thin film processes.

After the resistors 32 are applied the integrated circuit packages 12 are mounted to the surface pads 15 of the substrate 16. When cured the resistor material 32 may have a reflow temperature higher than the melting temperature of solder so that the material 32 does not liquefy during the soldering process of the integrated circuit package 12.

Applying the resistor material in liquid form reduces the amount of inventory space required to store the resistors. Additionally, the dispenser/template process is less complicated than soldering discrete resistors which typically require pick and place machines and a soldering station. As an alternate method the resistors 32 can be attached to the board 14 with the surface mounting of the packages 12.

What is claimed is:

1. A printed circuit board, comprising:

a substrate that has a top surface and a bottom surface; a power plane on said top surface; a ground plane on said bottom surface; a signal line located within said substrate; a via that is connected to said signal line and separated from said power plane by a space, said via having a wall that extends to said top surface; and, a resistor comprising an electrically conductive layer that extends across said space to connect said via wall and said power plane.

2. The printed circuit board as recited in claim 1, wherein said conductive layer is an electrically conductive ink.

3. A printed circuit board assembly, comprising:

a substrate that has a top surface and a bottom surface; a power plane on said top surface; a ground plane on said bottom surface; a signal line located within said substrate; a via that is connected to said signal line and separated from said power plane by a space, said via having a wall that extends to said top surface; a resistor comprising an electrically conductive layer that extend across said space to connect said via wall and said power plane; and, an integrated circuit package that is mounted to said top surface and connected to said power plane and said signal line.

4. The printed circuit board as recited in claim 3, wherein said conductive layer is an electrically conductive ink.

* * * * *

UNITED STATES PATENT AND TRADEMARK OFFICE
CERTIFICATE OF CORRECTION

PATENT NO.     : 5,990,421
DATED          : November 23, 1999
INVENTOR(S)    : Yee It is certified that error appears in the above-identified patent and that said Letters Patent is hereby corrected as shown below:

<u>Column 1,</u>
Line 25, after "board", insert -- with pull-up/pull-down resistors that minimizes the amount of board space required by the resistors and is relatively inexpensive to manufacture. --.

Signed and Sealed this

Twelfth Day of August, 2003

JAMES E. ROGAN
*Director of the United States Patent and Trademark Office*